United States Patent
Lu et al.

(10) Patent No.: US 11,651,825 B2
(45) Date of Patent: May 16, 2023

(54) RANDOM VALUE GENERATOR

(71) Applicant: Micron Technology, Inc., Boise, ID (US)

(72) Inventors: Zhongyuan Lu, Boise, ID (US); Hongmei Wang, Boise, ID (US); Robert J. Gleixner, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 89 days.

(21) Appl. No.: 17/227,977

(22) Filed: Apr. 12, 2021

(65) Prior Publication Data
US 2022/0328104 A1 Oct. 13, 2022

(51) Int. Cl.
*G06F 7/58* (2006.01)
*G11C 16/10* (2006.01)
*G11C 16/26* (2006.01)
*G11C 16/30* (2006.01)
*G11C 16/34* (2006.01)

(52) U.S. Cl.
CPC ............ *G11C 16/102* (2013.01); *G06F 7/588* (2013.01); *G11C 16/26* (2013.01); *G11C 16/30* (2013.01); *G11C 16/3409* (2013.01)

(58) Field of Classification Search
CPC ....... G11C 16/102; G11C 16/26; G11C 16/30; G11C 16/3409; G06F 7/588
USPC .................................................... 365/185.24
See application file for complete search history.

(56) References Cited

U.S. PATENT DOCUMENTS

| | | | |
|---|---|---|---|
| 9,575,727 B2 | 2/2017 | Sarpatwari et al. | |
| 11,139,016 B1* | 10/2021 | Pellizzer | G11C 11/40615 |
| 11,430,509 B2* | 8/2022 | Tortorelli | G11C 11/5628 |
| 2012/0239861 A1* | 9/2012 | Lee | G11C 11/5628 |
| | | | 711/E12.008 |
| 2013/0016562 A1* | 1/2013 | Mun | G11C 11/5628 |
| | | | 365/185.12 |
| 2014/0126285 A1* | 5/2014 | Kang | G11C 11/5642 |
| | | | 365/185.18 |
| 2014/0136583 A1 | 5/2014 | Hyde et al. | |
| 2014/0146607 A1 | 5/2014 | Nagai et al. | |
| 2016/0351271 A1* | 12/2016 | Lee | G11C 16/08 |
| 2020/0066343 A1* | 2/2020 | Castro | G11C 13/0007 |
| 2021/0358546 A1* | 11/2021 | Sinipete | G11C 13/0004 |

* cited by examiner

*Primary Examiner* — Ly D Pham
(74) *Attorney, Agent, or Firm* — Brooks, Cameron & Huebsch, PLLC

(57) ABSTRACT

The present disclosure includes systems, apparatuses, and methods related to generating a random data value. For example, a first read operation may be performed on a memory cell programmed to a first state, wherein the first read operation is performed using a first read voltage that is within a predetermined threshold voltage distribution corresponding to the first state. A programming signal may be applied to the memory cell responsive to the first read operation resulting in a snapback event, wherein the programming signal is configured to place the memory cell in a second state. A second read operation may be performed to determine whether the memory cell is in the first state or the second state using a second read voltage that is between the predetermined threshold voltage distribution corresponding to the first state and a second threshold voltage distribution corresponding to the second state.

20 Claims, 5 Drawing Sheets

RANDOM VALUE GENERATOR

TECHNICAL FIELD

The present disclosure relates generally to memory devices, and more particularly, to apparatuses for utilizing memory device to generate random data values.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), three-dimensional cross-point memory (e.g., 3D XPoint™), resistive random access memory (RRAM), ferroelectric random access memory (FeRAM), magnetoresistive random access memory (MRAM), and programmable conductive memory, among other types of memory.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, and movie players, among other electronic devices.

Memory cells can be programmed to states corresponding to one or more data values (e.g., logic "1" or "0"). In various instances, it may be useful to program one or more memory cells to a random data value. For example, various computer algorithms and/or applications utilize random data values (e.g., data values that are not determined by a programmer and/or are not predictable based on underlying parameters of the algorithm itself). Random data values can be used in a variety of contexts such as in probabilistic models, sampling values from probability densities, simulating stochastic processes, such as behavior of materials or financial markets, performing Monte Carlo simulations to approximate difficult to compute values, or adding additional security to passwords and encryption keys, among other applications.

DETAILED DESCRIPTION

Figure 1:
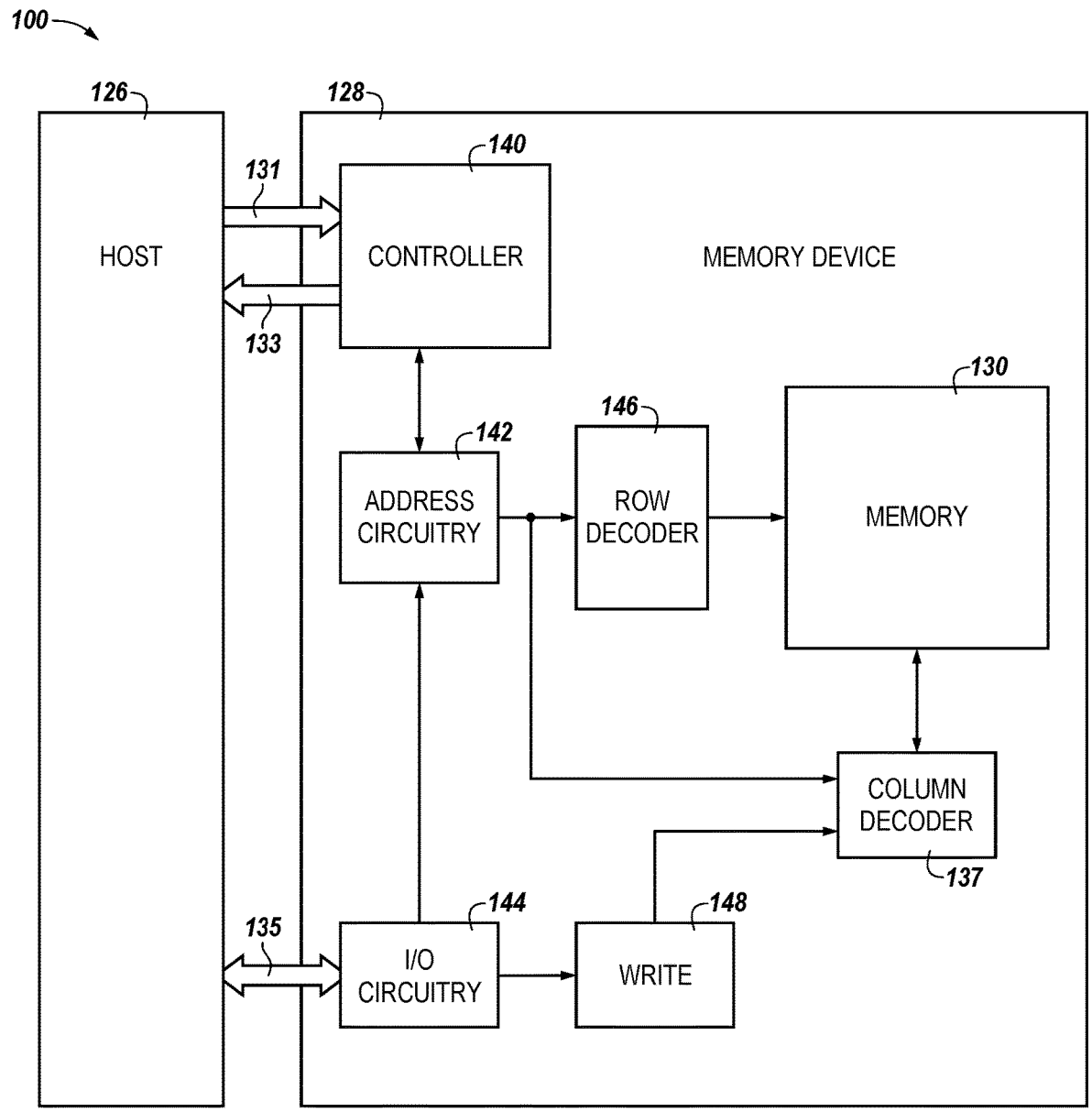
FIG. 1 is a block diagram of an apparatus in the form of a computing system including a memory device associated with generating a random data value in accordance with a number of examples of the present disclosure.

Various embodiments of the present disclosure provide the ability to generate a random data value. For example, a memory cell can be programmed to a logic "1" or a logic "0" in a random fashion, or a group of memory cells can be programmed such that each of the memory cells of the group stores a random logic "1" or "0." The random data value can be generated and/or read from the cell(s) responsive to a host request, for example. The random data values can be utilized for various purposes such as in association with executing various applications (e.g., cryptographic functions, key generation, encryption, masking protocols, digital signatures, digital gambling, etc.) For such applications and others, a random data value may be targeted and/or required to produce a random and/or unpredictable output.

As described further herein, a number of embodiments involve utilizing a threshold voltage (Vt) "bouncing" characteristic of resistance variable memory cells to generate a random data value. For example, the Vt of various resistance variable memory cells such as three-dimensional cross-point cells (e.g., 3D XPoint™) and/or self-selecting memory (SSM) cells exhibits a bouncing behavior that follows a normal (e.g., Gaussian) distribution. Since such memory cells exhibit ovonic threshold switching behavior, applying a read voltage (e.g., demarcation voltage Vdm) located at the center of the Vt distribution will generate a snapback event (e.g., ovonic threshold switching event) or not depending on whether the bouncing Vt of the cell is above or below the Vdm at the time of the read operation. As described further below, the resistance variable memory cells can comprise various chalcogenide materials among other materials exhibiting ovonic threshold switching behavior. As used herein, a SSM cell refers to a resistance variable memory cell in which a single material (e.g., chalcogenide) serves as both the switching element and the storage element for the memory cell.

As an example, consider a resistance variable memory cell programmable to one of a lower resistance state (e.g., a SET state) and a higher resistance state (e.g., RESET state). The programmed state of the cell can be determined by applying Vdm located between the set and reset distributions to the cell. If the Vt of cell is below the Vdm, then the cell will experience a snapback event, which indicates the cell was in the set state (e.g., the cell stored a logic 0). If the Vt of the cell is above the Vdm, then the cell will not experience the snapback event, which indicates that the cell was in the reset state (e.g., the cell stored a logic 1).

Embodiments of the present disclosure utilize the bouncing Vt characteristic to program a memory cell to a random data value (e.g., 1 or 0). The random data value can then be read from the cell and utilized in association with executing an application, which can include providing the generated random data value(s) to a requesting entity such as a host (e.g., host processor).

Various embodiments of the present disclosure can operate as a true random number generator (TRNG) as opposed to a pseudo-random number generator (PRNG) that may provide repeating patterns based on a seed value. Accordingly, embodiments of the present disclosure may be more effective and/or provide greater integrity for security/encryption applications, for example.

As used herein, "a", "an", or "a number of" can refer to one or more of something, and "a plurality of" can refer to two or more such things. For example, a memory device can refer to one or more memory devices, and a plurality of memory devices can refer to two or more memory devices. As used herein, "random" refers to various degrees of unpredictability regarding random data generation, including, without limitation, pseudorandom, random, apparent randomness, true randomness, and the like.

The figures herein follow a numbering convention in which the first digit or digits correspond to the drawing figure number and the remaining digits identify an element or component in the drawing. Similar elements or components between different figures may be identified by the use of similar digits.

FIG. 1 is a block diagram of an apparatus in the form of a computing system 100 including a memory device 128, in accordance with embodiments of the present disclosure. As used herein, a memory device 128, controller 140, and memory 130, might also be separately considered an "apparatus." The described components, configurations, and/or operation of the memory elements described with respect to FIG. 1 may include and/or be interchanged with the described components, configurations, and/or operations in relation to any other of the FIGS. 2-6.

In this example, the system 100 includes a host 126 coupled to the memory device 128, which includes a memory 130. The memory 130 can represent one or more memory arrays. The host 126 can be a host system such as a personal laptop computer, a desktop computer, a digital camera, a smart phone, or a memory card reader, among various other types of hosts. The host 126 can include a system motherboard and/or backplane and can include a number of processing resources (e.g., one or more processors, microprocessors, or some other type of controlling circuitry). The system 100 can include separate integrated circuits or both the host 126 and the memory device 128 can be on the same integrated circuit. The system 100 can be, for instance, a server system and/or a high-performance computing (HPC) system and/or a portion thereof. Although the example shown in FIG. 1 illustrates a system having a Von Neumann architecture, embodiments of the present disclosure can be implemented in non-Von Neumann architectures, which may not include one or more components (e.g., CPU, ALU, etc.) often associated with a Von Neumann architecture. In an example in which the system 100 comprises a solid state drive, the host 126 may be a system controller coupled to an external processor (not shown in FIG. 1). In some embodiments, the host 126 may be one or more host processors, and the memory device 128 can be a managed memory device with controller 140 serving as an on-die controller.

For clarity, the system 100 has been simplified to focus on features with particular relevance to the present disclosure. The memory 130 any type of memory, such as a DRAM array, a self-selecting memory (SSM) array, a 3-dimensional (3D) cross-point memory array (e.g., 3D XPoint™), SRAM array, STT RAM array, PCRAM array, TRAM array, RRAM array, NAND flash array, and/or NOR flash array, for instance.

The memory 103 may include a plurality of memory elements. The memory elements may be various types of variable resistance memory cells. The memory elements can include a storage element and a select element (e.g., a switching element) located between a pair of conductive lines (e.g., access lines, which may be referred to as word lines or select lines, and sense lines, which may be referred to as bit lines, data lines, or digit lines) such as in a cross-point configuration. For example, the storage element and/or switching element can be formed of one or more chalcogenide materials. In an SSM cell, a single chalcogenide material may serve as the storage element and switching element. For example, each memory cell may include a chalcogenide material that may be formed of various doped or undoped materials, that may or may not be a phase-change material, and/or that may or may not undergo a phase change during reading and/or writing the memory cell. Chalcogenide materials may be materials or alloys that include at least one of the elements S, Se, and Te. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—SbGe, Te—Ge—Sb—S, Te—Ge—Sn—O, Te—Ge—Sn—Au, Pd—Te—Ge—Sn, In—Se—Ti—Co, Ge—SbTe—Pd, Ge—Sb—Te—Co, Sb—Te—Bi—Se, Ag—In—Sb—Te, Ge—Sb—Se—Te, Ge—Sn—Sb—Te, GeTe—Sn—Ni, Ge—Te—Sn—Pd, or Ge—Te—Sn—Pt. Example chalcogenide materials can also include SAG-based glasses NON phase change materials such as SeAsGe. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer.

The memory device 128 includes address circuitry 142 to latch address signals provided over a bus 135 (e.g., an I/O bus) through I/O circuitry 144. Address signals are received through the address circuitry 142 and decoded by a row decoder 146 and a column decoder 137 to access the memory 130. The address signals can also be provided to the controller 140 (e.g., via the address circuitry 142 and/or via a control bus 131). Data can be read from the memory 130 by sensing voltage and/or current changes on the data lines using sensing circuitry (not illustrated). The sensing circuitry can read and latch a page (e.g., row) of data from the memory 130. The I/O circuitry 144 can be used for bi-directional data communication with the host 126 over the I/O bus 135. The write circuitry 148 is used to write data to the memory 130.

The memory cells of memory 130 can be programmed to a particular state (e.g., set or reset) corresponding to a bit value (e.g., 1 or 0). For example, the set state may be a relatively lower resistance state and the reset state may be a relatively higher resistance state.

Figure 2:
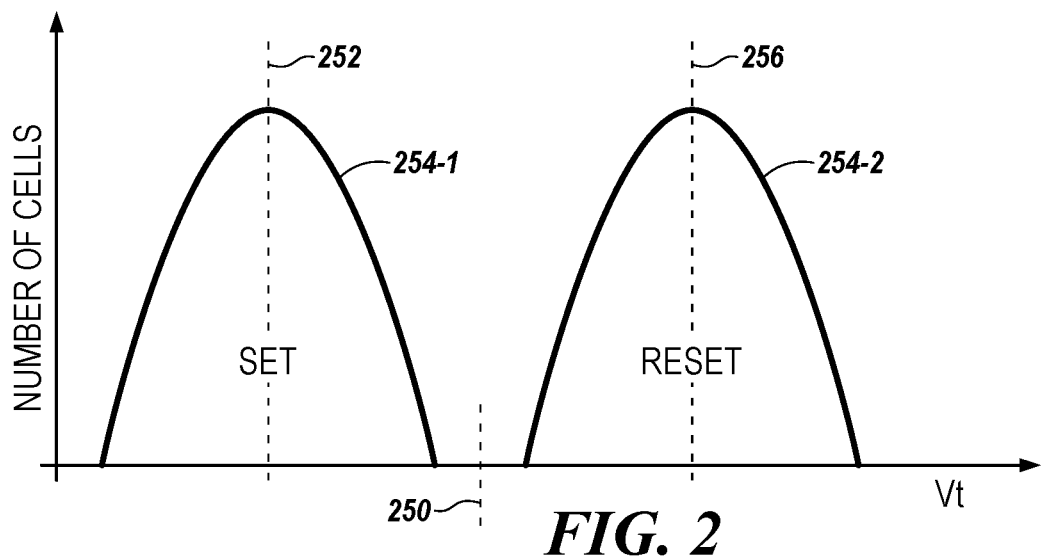
FIG. 2 is a diagram illustrating threshold voltage distributions corresponding to respective data states of memory cells operable to generate a random data value in accordance with a number of examples of the present disclosure.
Figure 3:
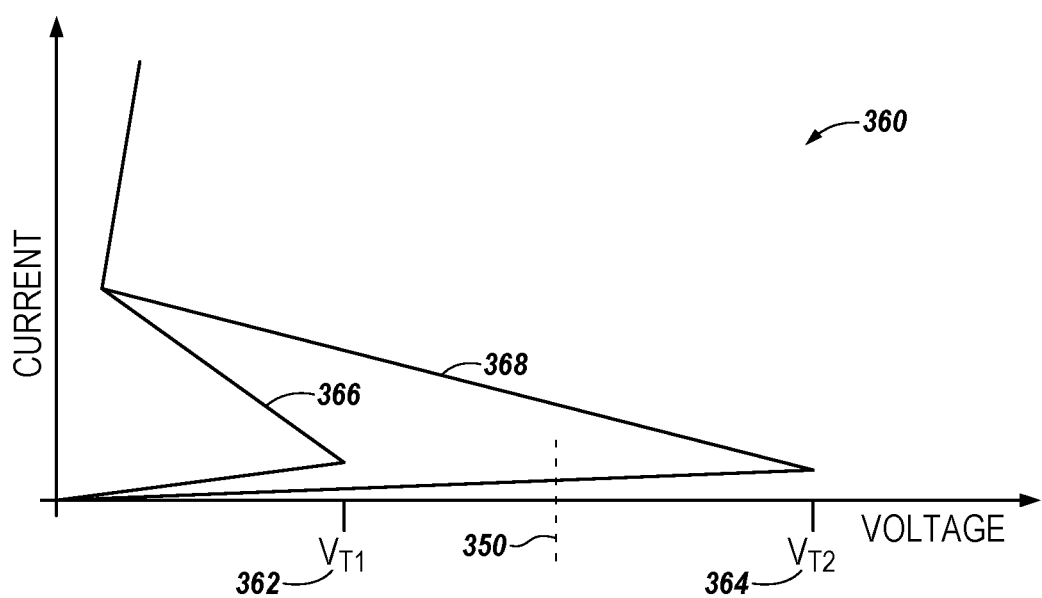
FIG. 3 is a graph illustrating examples of snap back events associated with generating a random data value consistent with a number of examples of the present disclosure.

As described further in association with FIGS. 2 and 3, the programmed state of a memory cell may be determined by applying a demarcation voltage (Vdm) across the memory cell, such as between a pair of signal lines (e.g., a bit line and a word line) to which the memory cell is coupled. The Vdm (e.g., read voltage) can be a voltage level between the set and reset distributions in order to determine the state of cell. If the Vdm is greater than the Vt of the memory cell, then a snap back current is generated (e.g., a snap back event is detected) indicating that the cell is in the set state, and if the Vdm is less than the Vt of the memory cell, then a snap back current is not generated indicating the cell is in the reset state.

The controller 140 (e.g., memory controller), which may be referred to as bank control logic and/or a sequencer, decodes signals provided by control bus 131 from the host 126. These signals can include chip enable signals, write enable signals, and address latch signals that are used to control operations performed on the memory 130, including data read, data write, and data erase operations. In various embodiments, the controller 140 is responsible for executing instructions from the host 126 and sequencing access to the array 130. The controller 140 can be a state machine, a sequencer, or some other type of control circuitry.

The controller 140 can control the operation (e.g., read, write, re-write, refresh, discharge) of memory cells through the various components. In some cases, one or more of the row decoder 146 and the column decoder 137 can be co-located with the controller 140. The controller 140 can generate row and column address signals in order to activate a desired access line and sense line. The controller 140 can also generate and control various voltages or currents used during the operation of a memory array. In general, the amplitude, shape, polarity, and/or duration of an applied voltage or current discussed herein can be adjusted or varied and may be different for the various operations discussed in operating the memory 130.

The controller 140 can be configured to perform additional functions as described herein. For example, the controller may be configured to generate a random data value based on a "bounce" or shift of a memory cell Vt. For example, the controller 140 may receive a request from a host 126 for a random data value. Responsive to the request from the host for the random data value, the controller 140 may be configured to perform the various operations described below in order to generate the random data value based on a "bounce" or shift of a memory cell Vt.

For example, the controller 140 may be configured to apply a first read voltage to a memory cell programmed to the first state, wherein the memory cell programmed to first state has a predetermined threshold voltage distribution associated therewith, and wherein the first read voltage has a value selected to be at a center of the predetermined threshold voltage distribution. The controller 140 may be configured to determine, based on whether a snapback event indicative of a value of a threshold voltage of the memory cell relative to the first read voltage is detected responsive to the application of the first read voltage, whether to leave the memory cell programmed to the first state or to apply a programming signal to the memory cell configured to place the memory cell in a second state corresponding to a second data value. The controller 140 may be configured to apply a second read voltage to the memory cell to determine whether the memory cell is in the first state or the second state, wherein the second read voltage is not within the predetermined threshold voltage distribution associated with the first state, wherein the generated random one of the first data value and the second data value is determined based on the threshold voltage of the memory cell relative to the first read voltage as confirmed by applying the second read voltage.

Once the controller 140 has caused the random data value to be generated, the controller 140 may cause the random data value to be communicated back to the host 126 in order to satisfy a previous request from the host 126 for the random data value. In some examples, the controller 140 may be configured to cause a plurality of random data values to be generated. The controller 140 may be configured to transmit the plurality of random data values back to the host 126 individually, in batches, and/or all at once. The plurality of random data values can be generated from a single cell via multiple iterations, and/or the plurality of random data values can be generated from respective different memory cells. In some examples, such as described with respect to FIG. 5 and FIG. 6, a plurality of different memory cells memory cells and/or portions of a plurality of different memory cells may be grouped in order to generate a plurality of random data values.

FIG. 2 is a diagram illustrating threshold voltage distributions 254-1 and 254-2 corresponding to respective data states of memory cells, such as the memory cells in memory 130 operable in accordance with a number of examples of the present disclosure. The described components, configurations, and/or operation of the memory elements described with respect to FIG. 2 may include and/or be interchanged with the described components, configurations, and/or operations in relation to any other of the FIGS. 1 and 3-6.

As an example, distribution 254-1 may be referred to as the set state, which can correspond to a low Vt state, and distribution 254-2 may be referred to as the reset state, which can correspond to a high Vt state (e.g., a state corresponding to relatively high Vt levels as compared to the Vt levels corresponding to the set state). That is, the threshold voltage distribution 254-1 may correspond to a range of threshold voltages for the set state and the threshold voltage distribution 254-2 may correspond to the range of threshold voltages for the reset state of a memory cell. In this example, distribution 254-1 corresponds to a logic "1" and distribution 254-2 corresponds to a logic "0"; however, embodiments are not limited to this assigned encoding. Threshold voltage distributions 254-1 and 254-2 may have an approximately normal distribution (e.g., Gaussian), as illustrated, however, embodiments are not limited to such distributions.

In some examples, the threshold voltage distributions 254-1 and 254-2 may be experimentally determined. For example, a memory cell may be tested to determine the threshold voltage distributions 251-1 and 254-2 for each data state to be stored in a memory cell. That is, the voltage distribution for a particular state stored on a particular memory cell may be determined based on a plurality of programming and read operations performed on the memory cell prior to its shipping or sale. In some examples, the threshold voltage distributions 254-1 and 254-2 may be determined and/or specified by a manufacturer on the basis of thousands of tests of the memory cell and/or knowledge of the physical properties and/or electrical behavior of the memory cell. In this manner, the threshold voltage distributions 254-1 and 254-2 may be predetermined for each data state for a given memory cell or group of memory cells. That is, the threshold voltage distributions 254-1 and 254-2 may be determined prior to distributing, selling, or using the memory cell. In some examples, the threshold voltage distributions 254-1 and 254-2 may be pre-determined prior to performing a series of operations described herein and associated with generating a random data value based off Vt bouncing.

As used herein, Vt bouncing may refer to the fluctuation of the Vt within its threshold voltage distribution curves under the same testing parameters. For example, a memory cell may have a first Vt. That first Vt may be the Vt for the set state. The first Vt, at any given time, may be located anywhere along the threshold voltage distribution 254-1 for the set state for the memory cell. Likewise, the memory cell may have a second Vt. The second Vt may be the Vt for the reset state. The second Vt, at any given time, may be located anywhere along the threshold voltage distribution 254-2 for the reset state for the memory cell. The fluctuation of the Vts within their respective threshold voltage distributions 254-1 and 254-2 may be referred to as Vt bouncing. The source of Vt bouncing may include fluctuations in physical properties of the memory cell, the environment, and/or other sources of variation. The Vt bouncing described herein is separate and distinct from Vt drift (e.g., increasing Vt levels with time), which may be experienced by various resistance variable memory cells (e.g., chalcogenide based memory cells).

As described above, a data state of a memory cell may be determined by applying a Vdm across the memory cell. For example, a Vdm 250 may be applied having a voltage level in between the threshold voltage distributions 254-1 and 254-2. By applying the Vdm 250 in this intermediary point between the voltage distributions 254-1 and 254-2, no matter where the Vt for the set state is along its corresponding threshold voltage distribution 254-1 or where the Vt for the reset state is along its corresponding threshold voltage distribution 254-1, the presence of a snap back current would indicate that the memory cell being read has a Vt below Vdm 250 and is in the set state. On the other hand, the absence of a snap back current would indicate that the memory cell being read has a Vt above Vdm 250 and is in the reset state. Again, this would be true regardless of where the Vt of each state actually is at the moment of reading since substantially the entire threshold voltage distributions 254-1 is below the Vdm 250 and substantially the entire threshold voltage distributions 254-2 is below the Vdm 250.

The fluctuation or bounce of the actual location of the Vt of a data state of a memory cell may have a normal distribution about its corresponding threshold voltage distribution. For example, the illustrated threshold voltage distribution 254-1 for the first state of the memory cell may correspond to and/or illustrate the Vt bounce for the first state of the memory cell and the illustrated threshold voltage distribution 254-2 for the second state of the memory cell may correspond to and/or illustrate the Vt bounce for the second state of the memory cell.

The threshold voltage distribution 254-1 for the first state of the memory cell may include a center Vt value 252. A center Vt value 252 may include a voltage value that is at the center of the threshold voltage distribution 254-1. The center Vt value 250 may include a voltage value corresponding to the midpoint on the curve of a normally distributed threshold voltage distribution 254-1 for a memory cell programmed to a first state. For example, the center Vt value 252 may be a voltage value along the threshold voltage distribution 254-1 that is in the middle of the threshold voltage distribution 254-1 corresponding to the Vt bounce. As such, fifty percent of the time the Vt for the memory cell programmed to the first state is above the center Vt value 252 and fifty percent of the time the Vt for the memory cell programmed to the first state is below the center Vt value 252. Therefore, applying a voltage having the center Vt value 252 across the memory cell programmed to the first state will result in a snap back event fifty percent of the time and will not result in a snap back event fifty percent of the time. Thus, applying a voltage having the center Vt value 252 across the memory cell programmed to the first state will result in a truly random occurrence of a snap back event.

The threshold voltage distribution 254-2 for the second state of the memory cell may include a center Vt value 256. A center Vt value 256 may include a voltage value that is at the center of the threshold voltage distribution 254-2. The center Vt value 256 may include a voltage value corresponding to the midpoint on the curve of a normally distributed threshold voltage distribution 254-2 for a memory cell programmed to a second state. For example, the center Vt value 256 may be a voltage value along the threshold voltage distribution 254-2 that is in the middle of the threshold voltage distribution 254-2 corresponding to the Vt bounce. As such, fifty percent of the time the Vt for the memory cell programmed to the first state is above the center Vt value 252 and fifty percent of the time the Vt for the memory cell programmed to the first state is below the center Vt value 252. Therefore, applying a voltage having the center Vt value 252 across the memory cell programmed to the second state will result in a snap back event fifty percent of the time and will not result in a snap back event fifty percent of the time. Thus, applying a voltage having the center Vt value 256 across the memory cell programmed to the second state will result in a truly random occurrence of a snap back event.

FIG. 3 is a graph 360 illustrating examples of snap back events that may or may not be exhibited by a memory cell in response to applying a voltage level in accordance with a number of examples of the present disclosure. The described components, configurations, and/or operation of the memory elements described with respect to FIG. 3 may include and/or be interchanged with the described components, configurations, and/or operations in relation to any other of the FIGS. 1-2 and 4-6.

In the graph 360, the horizontal axis represents an applied voltage and the vertical axis represents a current level. The horizontal axis includes a first threshold voltage level (VT1) 362 and a second threshold voltage level (VT2) 364. VT1 may correspond to a threshold voltage associated with the first possible state of the memory cell, for example the set state. For example, VT1 may correspond to a voltage value, when applied to a memory cell programmed to a first state, that generates a snapback event in the cell.

VT2 may correspond to a threshold voltage associated with the second possible state of the memory cell, for example the reset state. For example, VT2 may correspond to a voltage value, when applied to a memory cell programmed to a first state, that generates a snapback event in the cell.

Additionally, the horizontal axis includes a voltage value 350 corresponding to a typical Vdm applied between the VT1 and VT2. The Vdm voltage value 350 may be applied to determine a data state of a memory cell. The Vdm voltage value 350 may correspond to Vdm 250 illustrated in FIG. 2 and may be located between the threshold voltage distributions 254-1 and 254-2 illustrated in FIG. 2. By applying the Vdm voltage value 350 in this intermediary point between VT1 and VT2, the presence of a snap back current would indicate that the memory cell being read has a Vt (e.g., VT1) below Vdm voltage value 350 and is in the set state. On the other hand, the absence of a snap back current when the Vdm voltage value 350 is applied would indicate that the memory cell being read has a Vt (e.g., VT2) above Vdm voltage value 350 and is in the reset state.

For example, if the Vdm voltage value 350 is applied to the memory cell when the memory cell is programmed to the first state, a snap back event 366, illustrated as a rapid jump to higher current level, may occur since the VT1 voltage level is met and/or exceeded. However, if the Vdm voltage value 350 is applied to the memory cell when it is programmed to the second state, a snap back event 368, illustrated as a rapid jump to higher current level, may not occur since the VT2 voltage level is not met and/or exceeded. That is, at the application of the Vdm voltage value 350 to a memory cell programmed to the second state having a second threshold value (e.g., VT2) the current level within the memory cell (visible as the portion of 368 intersected by the hashed line of 350) still has a relatively flat/gradual slope and has not yet experienced the sudden jump in current level indicative of a snap back event.

Referring back to the discussion of FIG. 2, there is fluctuation or bounce of the actual voltage amount of the Vt of a data state of a memory cell. Therefore, while FIG. 3 illustrates the VT1 362 and VT2 364 at single voltage values, in reality the precise Vts of the two states may bounce. As such, the application of a voltage precisely at the VT1 level to a memory cell programmed to a first state may or may not generate a snap back event based on whether the actual Vt for that first state happens to be bouncing below, at, or above the VT1 at the moment of its application. Likewise, the application of a voltage precisely at the VT2 level to a memory cell programmed to a second state may or may not generate a snap back event based on whether the actual Vt for that second state happens to be bouncing below, at, or above the VT2 at the moment of its application.

The Vt bounce associated with each state can have a normal distribution (e.g., Gaussian). The precise distribution of a particular memory cell or group of memory cells programmed to a particular state may be predetermined and established prior to selection of a voltage value to be applied to the memory cell. Again, referring back to FIG. 2, a center Vt value (e.g., center Vt value 252 of FIG. 2) of a first state may be selected from among the threshold voltage distribution at a midpoint which results in the snap back event 366 being detected fifty percent of the time and not detected fifty percent of the time when the center Vt value of the first state is applied to the memory cell programmed to the first state. Likewise, a center Vt value (e.g., center Vt value 256 of FIG. 2) of a second state may be selected from among the threshold voltage distribution at a midpoint which results in the snap back event 368 being detected fifty percent of the time and not detected fifty percent of the time when the center Vt value of the second state is applied to the memory cell programmed to the first state.

Figure 4A:
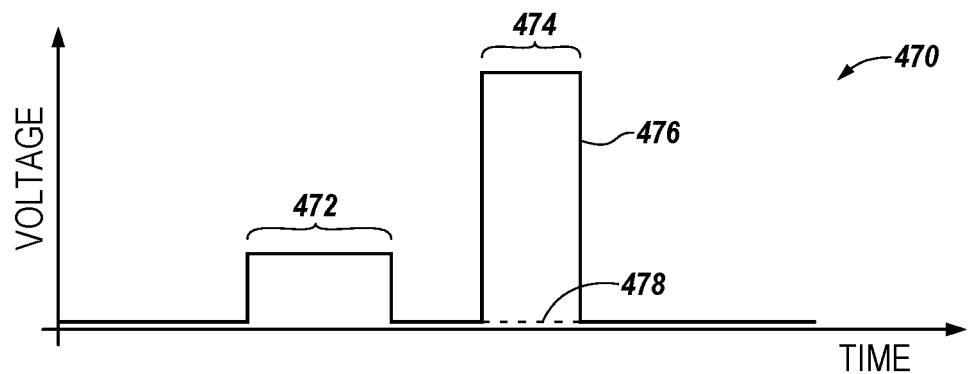
FIGS. 4A-4C are graphs illustrating various examples of pre-reading sequences of a memory cell associated with generating a random data value consistent with a number of examples of the present disclosure.
Figure 4B:
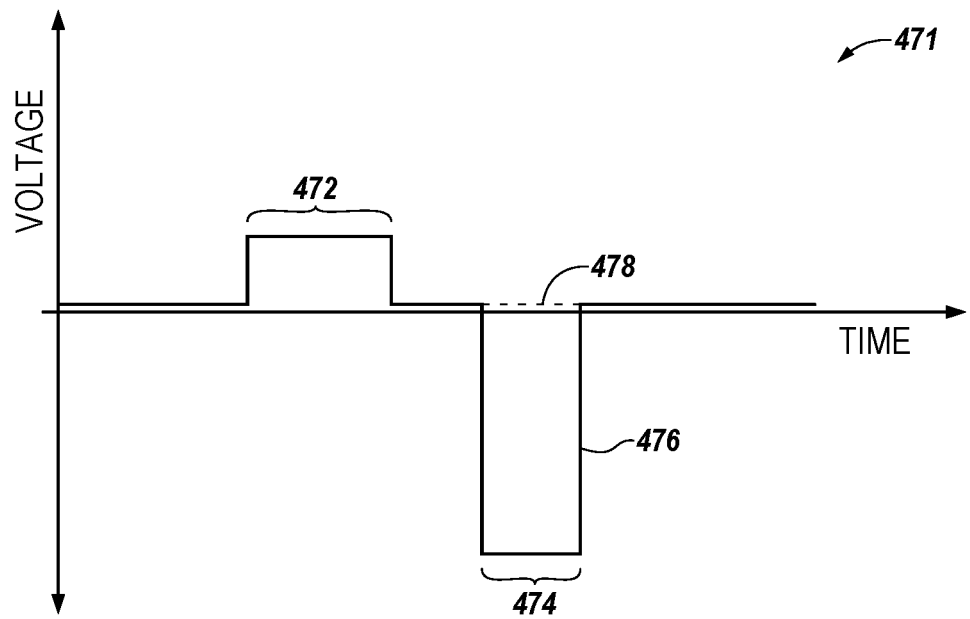
Figure 4C:
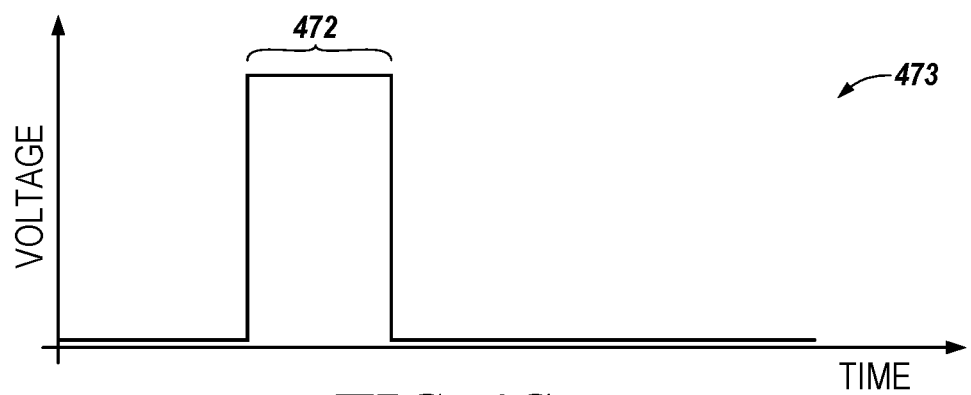

FIGS. 4A-4C are graphs illustrating examples of pre-reading sequences of memory cells associated with generating random data values consistent with a number of examples of the present disclosure. The described components, configurations, and/or operation of the memory elements described with respect to FIGS. 4A-4C may include and/or be interchanged with the described components, configurations, and/or operations in relation to any other of the FIGS. 1-3 and 5-6. FIGS. 4A-4C may illustrate examples of a variety of pre-reading sequences that may be utilized across various memory array architectures and initial memory cell states to generate random data values consistent with a number of examples of the present disclosure For example, FIG. 4A is a graph illustrating an example of a pre-reading sequence 470 of a memory cell associated with generating a random data value consistent with a number of examples of the present disclosure. For example, FIG. 4A illustrates an example of a prereading sequence 470 of a memory cell such as a memory cell in 3D XPoint™ memory. For example, FIG. 4A illustrates an example of a prereading sequence 470 of a memory cell initially programmed to a set state or a low Vt state.

The pre-reading sequence 470 graph illustrates increasing time on the horizontal axis and increasing voltage on the vertical axis. The pre-reading sequence 470 may correspond to a set of operations to generate a random data value. In some examples, the set of operations may be performed and/or be caused to be performed by a memory controller such as memory controller 140 depicted in FIG. 1. In some examples, the pre-reading sequence 470 may be executed or caused to be executed by a controller in response to a request for a random data value from a host, such as host 126 depicted in FIG. 1.

The pre-reading sequence 470 may differ from a normal or traditional programming sequence. Normal or typical programming sequences may involve performing a pre-read of a memory cell by utilizing a Vdm between the threshold voltage distributions of possible states stored in the memory cell to determine, based on detecting a snap event, whether the memory cell is programed to a first state or a second state corresponding to storing a first data value or a second data value. Then, the normal or typical programming sequence may involve programming the memory cell to, for example, the reset state by applying a programming pulse at a voltage level higher than an uppermost reset Vt distribution in some examples such as a memory cell in 3D XPoint™ memory where the reset state is a high Vt state.

In contrast, the pre-reading sequence 470 may include a pre-read operation 472. The pre-reading operation 472 may correspond to the application of a first voltage value across a memory cell. The memory cell may be programmed to a known data state (e.g., set, reset, 0, 1, high resistance, low resistance, etc.). This may mean that the memory cell has previously been read as storing a known data state during a previous read. It may also mean that the memory cell has been pre-programmed to a known state with a write pulse. For example, the memory cell subjected to the pre-reading sequence 470 may include a memory cell in 3D XPoint™ memory pre-programmed to a first state such as a set state or low Vt state.

Upon programming a memory cell to a particular state, the corresponding threshold voltage may be somewhat unstable for a period of time following programming. As such, examples contemplated herein may include making time allotments for the threshold voltage of a memory cell to drift for a pre-defined period of time after programming in order to allow the threshold voltage distribution time to drift and stabilize. For example, pre-programming a memory cell to a known state may include stabilizing a threshold voltage of the memory cell pre-programmed to the first state by pre-drifting the memory cell following pre-programming the memory cell to the first state and prior to performing the pre-read operation 472 described below.

The memory cell may have a threshold voltage distribution corresponding to each state. That is, the Vt of the first data state in a memory cell storing a first data state may bounce or fluctuate within a first range of voltage values. The first range of voltage values may have a normal distribution corresponding to the threshold voltage distribution for the first state in the memory cell. Further, the Vt of the second data state in a memory cell storing a second data state may bounce or fluctuate within a second range of voltage values. The second range of voltage values may have a normal distribution corresponding to the threshold voltage distribution for the second state in the memory cell.

The threshold voltage distribution corresponding to the first data state in the memory cell as well as the threshold voltage distribution corresponding to the second data state in the memory cell may be predetermined. For example, the threshold voltage distribution corresponding to the first data state and the threshold voltage distribution corresponding to the second data state may be known and/or defined prior to the pre-reading sequence 470. In some examples, the threshold voltage distribution corresponding to the first data state and the threshold voltage distribution corresponding to the second data state may be experimentally determined and/or specified by a manufacturer prior to the pre-reading sequence 470.

The pre-read operation 472 may be performed at a first read voltage. The first read voltage may be selected as a first read voltage that is within a predetermined threshold voltage distribution corresponding to the first state when the memory cell is programmed to a first state. For example, the first pre-read operation 472 may be performed at a first read voltage that is within a predetermined threshold voltage distribution corresponding to the set or low Vt data state of a memory cell in 3D XPoint™ memory.

The pre-read operation 472 may be performed by applying, across the memory cell, a first read voltage corresponding to the center of the of the predetermined threshold voltage distribution to which the memory cell is programmed and monitoring whether a snap back event is detected in response.

For example, where the memory cell is known to be programmed to a first state, the pre-read operation 472 may include applying a voltage having a value corresponding to a center and/or midpoint of the predetermined threshold voltage distribution for the first data state in the memory cell storing the first data state. In an example, a memory cell may be programmed to a set state. A threshold voltage distribution for that particular memory cell storing that particular set state may be predetermined. The pre-read operation 472 may involve applying a voltage from the center or midpoint of the threshold voltage distribution for that particular memory cell storing that particular set state.

Likewise, where the memory cell is known to be programmed to a second state, the pre-read operation 472 may include applying a voltage having a value corresponding to a center and/or midpoint of the predetermined threshold voltage distribution for the second data state in the memory cell storing the second data state. In an example, a memory cell may be programmed to a reset or high Vt data state. A threshold voltage distribution for that particular memory cell storing that particular reset state may be predetermined. The pre-read operation 472 may involve applying a voltage from the center or midpoint of the threshold voltage distribution for that particular memory cell storing that particular reset state.

That is, in contrast to a normal or traditional read operation of a memory cell that utilizes a Vdm between the threshold voltage distributions of possible states stored in the memory cell, examples consistent with the present disclosure involve a pre-read operation 472 which performs a pre-read utilizing a voltage selected to be at the center of a distribution of pre-characterized Vt fluctuations for a data state that the memory cell is pre-determined to be storing.

As described above, applying a voltage selected to be at the center of a distribution of pre-characterized Vt fluctuations for a data state that the memory cell is pre-determined to be storing may have the effect of randomly triggering a snap back event. That is, since the actual Vt of a memory cell storing a particular state is naturally fluctuating within a pre-characterized distribution, applying a voltage that is at the center of that distribution may have the effect of triggering a snap back event fifty percent of the time and may not trigger a snap back event fifty percent of the time. Whether the actual Vt at, above, or below a voltage that is at the center of that distribution when it is applied is a random occurrence.

As such, application of the voltage that is at the center of that distribution that the memory cell is known to be programmed to is capable of producing a truly random outcome to the pre-read operation 472. Unlike utilizing the Vdm between the threshold voltage distributions of possible states stored in the memory cell, applying the voltage that is at the center of that distribution that the memory cell is known to be programmed to will not provide information sufficient to distinguish the data state or data value stored by the memory cell with any certainty. Instead, applying the voltage that is at the center of the distribution of the know data state or data value stored in the memory cell with produce a random outcome that corresponds to the actual Vt at the time of the pre-read operation 472 being at or below the applied voltage (e.g., evidenced by the detection of a snap back event) or being above the applied voltage (e.g., evidenced by no detection of a snap back event).

The pre-reading sequence 470 may include a programming operation 474. For example, the programming operation 474 may include programming the memory cell to a data state other than the data state it was storing during the pre-read operation 472. For example, if the memory cell is programmed to the set state, the programming operation 474 may include reprogramming the memory cell to be in the reset data. This pre-reading sequence is illustrated as the solid line 476.

However, the programming operation 474 may be an optional portion of the pre-reading sequence 470. In some examples, the programming operation 474 may be skipped and the memory cell may be left in the data state it was programmed to during the pre-read operation 472. For example, if the memory cell is programmed to the set state, the programming operation 474 may, in some instances, be skipped and the memory cell may be left programmed in the set state. This pre-reading sequence is illustrated as the dashed line 478.

Additionally, the programming operation 474 may be skipped since, in some examples, the snapback event itself may place the memory cell in a data state other than the data state it was storing during the pre-read operation 472. For example, as illustrated in FIG. 4C, the programming operation 474 may be skipped since a snap back event caused by the pre-read operation 472 to a memory cell, initially programmed to a reset high Vt data state, at a voltage corresponding to the center of the distribution of the reset state may actually be programmed to the set low Vt data state by the snap back event. However, in any case including those where the snap back event programmed the cell, the programming operation 474 may be performed in order to optimize the programming to the new data state and/or reinforce electrical uniformity among the memory cells with respect to the Vt distributions of their new data state.

A controller, such as the controller 140 illustrated in FIG. 1, may be configured to determine whether or not to perform the programming operation 474. For example, the controller may be configured to determine whether to leave the memory cell programmed to a first data state corresponding to a first data value or to apply a programming signal to the memory cell configured to place the memory cell in a second data state corresponding to a second data value based on whether a snap back event was detected in the pre-read operation 472.

For example, a memory cell may be programmed to a set state. In the pre-read operation 472, a voltage may be applied across the memory cell. The voltage may be a voltage at a center or midpoint of a predetermined voltage threshold distribution for the Vt of the set state for the memory cell. The application of the voltage at this level may produce snap back events in a random distribution based on whether the actual Vt of the set state for the memory cell has bounced at, above, or below the applied voltage during the pre-read operation 472. For example, if a snap back event is detected the controller may be configured to perform the programming operation 474 by causing a write pulse to be applied to the memory cell to write the memory cell from a set state to a reset state. If a snap back event is not detected, then the controller may be configured to forgo the programming operation 474 and leave the memory cell in the set state.

However, examples are not so limited. For example, other examples are contemplated where detecting the snap back event has the opposite effect as those described above with respect to maintaining or altering the data state of the memory cell.

Following the pre-reading sequence 470, the controller may perform a second read operation. The second read may be performed after a delay following the programming operation 474 in order to allow the threshold voltage distribution time to drift and stabilize after programming and prior to the second read. The second read operation may include applying a voltage across the memory cell while monitoring for snap back events. For example, the second read operation may be performed in order to determine whether the memory cell is now programmed in the first data state or the second data state following the pre-reading sequence 470. For example, the memory cell may be read utilizing a voltage at a typical Vdm level selected to be between the predetermined threshold voltage distribution corresponding to the Vt of the first data state (e.g., set state) for the memory cell and the predetermined threshold voltage distribution corresponding to the Vt of the second data state (e.g., reset state) for the memory cell. As such, reading the memory cell utilizing this Vdm will allow for the confirmation of the data state of the memory cell following the pre-reading sequence 470.

For example, if a snap back event is detected when the Vdm voltage is applied, this may indicate that the memory cell is programmed to a first data state having a threshold voltage distribution below the applied voltage. Alternatively, when the Vdm voltage is applied and no snap back event is detected, this may indicate that the memory cell is programmed to a second data state having a threshold voltage distribution above the applied voltage. For example, detecting a snap back event may indicate that the memory cell is in the set state when the Vdm voltage is applied. Conversely, not detecting a snap back event may indicate that the memory cell is in the reset state when the Vdm voltage is applied.

As described above, the determination of whether to leave the memory cell in the state that it was programmed to during the pre-read operation 472 or to program it to a different state is based on whether a snap back event was detected when the voltage that is at the center of the predetermined threshold voltage distribution corresponding to the data state to which the memory cell is known to be programmed. As described above, it is random whether or a snap back event will occur upon application of the voltage that is at the center of the predetermined threshold voltage distribution corresponding to the data state to which the memory cell is known to be programmed. As such, a result of the second read operation confirming whether the memory cell was left in the state it was programmed to during the pre-read operation 472 or changed will also be a random output. Therefore, a result of the second read operation may correspond to a random data value (e.g., set, reset, 0, 1, low resistance, high resistance, etc.) associated with the detected state of the memory cell upon the second read operation.

The controller may cause the random data value output from the second read operation and/or a data value determined from the random data value output from the second read operation to be communicated to a host. For example, the controller may communicate the random data value to a host in order to satisfy a request from the host for a random data value. The random data value may be utilized in cryptographic functions, key generation, encryption, masking protocols, digital signatures, digital gambling, etc.

If more than one random data value is requested by a host, the controller may repeat the described operations in order to produce additional random data values. For example, the controller may program the memory cell to a first state. The controller may perform another pre-read operation on the memory cell using a read voltage that is within the predetermined threshold voltage distribution corresponding to the first state. For example, the read voltage may be the voltage at the center or midpoint of the predetermined threshold voltage distribution corresponding to the first state. The controller may determine, based on whether a snap back event was detected during the application of the read voltage, whether to leave the memory cell programmed to the first state or to program the memory cell to the second state. The controller may perform a follow up read operation by applying the Vdm voltage between the threshold voltage distributions of the first and second states in order to confirm whether the memory cell is in the first or second state. The controller may communicate out the resulting random data value to the host. This process may be repeated on a single cell as many times as is needed to satisfy a request for random data values.

Additionally, this process may be performed on a plurality of memory cells simultaneously in order to more rapidly satisfy a request for random data values.

FIG. 4B is a graph illustrating an example of a pre-reading sequence 471 of a memory cell associated with generating a random data value consistent with a number of examples of the present disclosure. For example, FIG. 4B illustrates an example of a prereading sequence 470 of a memory cell such as a SSM cell. FIG. 4B illustrates an example of a prereading sequence 470 of a memory cell initially programmed to a set state or a low Vt state.

Similar to pre-reading sequence 470 of FIG. 4A, the pre-reading sequence 471 may include a pre-read operation 472. The pre-reading operation 472 may correspond to the application of a first voltage value across a memory cell. The memory cell may be programmed to a known data state (e.g., set, reset, 0, 1, high resistance, low resistance, etc.). This may mean that the memory cell has previously been read as storing a known data state during a previous read. It may also mean that the memory cell has been pre-programmed to a known state with a write pulse. For example, the memory cell subjected to the pre-reading sequence 470 may include an SSM cell pre-programmed to a first state such as a set state.

As described in relation to FIG. 4A, the memory cell pre-programming a memory cell to a known state may include stabilizing a threshold voltage of the memory cell pre-programmed to the first state by pre-drifting the memory cell following pre-programming the memory cell to the first state and prior to performing the pre-read operation 472.

The memory cell may have a threshold voltage distribution corresponding to each state. That is, the Vt of the first data state in a memory cell storing a first data state may bounce or fluctuate within a first range of voltage values. The first range of voltage values may have a normal distribution corresponding to the threshold voltage distribution for the first state in the memory cell. Further, the Vt of the second data state in a memory cell storing a second data state may bounce or fluctuate within a second range of voltage values. The second range of voltage values may have a normal distribution corresponding to the threshold voltage distribution for the second state in the memory cell. In some examples, the polarity associated with each state may be opposite to one another.

The threshold voltage distribution corresponding to the first data state in the memory cell as well as the threshold voltage distribution corresponding to the second data state in the memory cell may be predetermined. For example, the threshold voltage distribution corresponding to the first data state and the threshold voltage distribution corresponding to the second data state may be known and/or defined prior to the pre-reading sequence 471. In some examples, the threshold voltage distribution corresponding to the first data state and the threshold voltage distribution corresponding to the second data state may be experimentally determined and/or specified by a manufacturer prior to the pre-reading sequence 471.

The pre-read operation 472 may be performed at a first read voltage. The first read voltage may be selected as a first read voltage that is within a predetermined threshold voltage distribution corresponding to the first state when the memory cell is programmed to a first state. For example, the first pre-read operation 472 may be performed at a first read voltage that is within a predetermined threshold voltage distribution corresponding to the set data state of a memory cell in a SSM device.

The pre-read operation 472 may be performed by applying, across the memory cell, a first read voltage corresponding to the center of the of the predetermined threshold voltage distribution to which the memory cell is programmed and monitoring whether a snap back event is detected in response.

For example, where the memory cell is known to be programmed to a first state, the pre-read operation 472 may include applying a voltage having a value corresponding to a center and/or midpoint of the predetermined threshold voltage distribution for the first data state in the memory cell storing the first data state. In an example, a memory cell may be programmed to a set state. A threshold voltage distribution for that particular memory cell storing that particular set state may be predetermined. The pre-read operation 472 may involve applying a voltage from the center or midpoint of the threshold voltage distribution for that particular memory cell storing that particular set state.

Likewise, where the memory cell is known to be programmed to a second state, the pre-read operation 472 may include applying a voltage having a value corresponding to a center and/or midpoint of the predetermined threshold voltage distribution for the second data state in the memory cell storing the second data state. In an example, a memory cell may be programmed to a reset data state. A threshold voltage distribution for that particular memory cell storing that particular reset state may be predetermined. The pre-read operation 472 may involve applying a voltage from the center or midpoint of the threshold voltage distribution for that particular memory cell storing that particular reset state. In some examples including memory cells of an SSM device, the polarity of the threshold voltage distribution of the reset state and/or its mid-point may have an opposite polarity to the threshold voltage distribution of the set state and/or its mid-point.

As described above, applying a voltage selected to be at the center of a distribution of pre-characterized Vt fluctuations for a data state that the memory cell is pre-determined to be storing may have the effect of randomly triggering a snap back event. That is, since the actual Vt of a memory cell storing a particular state is naturally fluctuating within a pre-characterized distribution, applying a voltage that is at the center of that distribution may have the effect of triggering a snap back event fifty percent of the time and may not trigger a snap back event fifty percent of the time. Whether the actual Vt at, above, or below a voltage that is at the center of that distribution when it is applied is a random occurrence.

As such, application of the voltage that is at the center of that distribution that the memory cell is known to be programmed to is capable of producing a truly random outcome to the pre-read operation 472. Unlike utilizing the Vdm between the threshold voltage distributions of possible states stored in the memory cell, applying the voltage that is at the center of that distribution that the memory cell is known to be programmed to will not provide information sufficient to distinguish the data state or data value stored by the memory cell with any certainty. Instead, applying the voltage that is at the center of the distribution of the know data state or data value stored in the memory cell with produce a random outcome that corresponds to the actual Vt at the time of the pre-read operation 472 being at or below the applied voltage (e.g., evidenced by the detection of a snap back event) or being above the applied voltage (e.g., evidenced by no detection of a snap back event).

The pre-reading sequence 471 may include a programming operation 474. For example, the programming operation 474 may include programming the memory cell to a data state other than the data state it was storing during the pre-read operation 472. For example, if the memory cell is programmed to the set state, the programming operation 474 may include reprogramming the memory cell to be in the reset data. This pre-reading sequence is illustrated as the solid line 476. As illustrated, the programming operation 474 may include the application of a programming voltage to the memory cell that has an opposite polarity to that of the voltage applied in the pre-read operation 472.

The programming operation 474 may be an optional portion of the pre-reading sequence 470. In some examples, the programming operation 474 may be skipped and the memory cell may be left in the data state it was programmed to during the pre-read operation 472. For example, if the memory cell is programmed to the set state, the programming operation 474 may, in some instances, be skipped and the memory cell may be left programmed in the set state. This pre-reading sequence is illustrated as the dashed line 478.

A controller, such as the controller 140 illustrated in FIG. 1, may be configured to determine whether or not to perform the programming operation 474. For example, the controller may be configured to determine whether to leave the memory cell programmed to a first data state corresponding to a first data value or to apply a programming signal to the memory cell configured to place the memory cell in a second data state corresponding to a second data value based on whether a snap back event was detected in the pre-read operation 472.

For example, a memory cell may be programmed to a set state. In the pre-read operation 472, a voltage may be applied across the memory cell. The voltage may be a voltage at a center or midpoint of a predetermined voltage threshold distribution for the Vt of the set state for the memory cell. The application of the voltage at this level may produce snap back events in a random distribution based on whether the actual Vt of the set state for the memory cell has bounced at, above, or below the applied voltage during the pre-read operation 472. For example, if a snap back event is detected the controller may be configured to perform the programming operation 474 by causing a write pulse to be applied to the memory cell to write the memory cell from a set state to a reset state. If a snap back event is not detected, then the controller may be configured to forgo the programming operation 474 and leave the memory cell in the set state. Other examples are contemplated where detecting the snap back event has the opposite effect as those described above with respect to maintaining or altering the data state of the memory cell.

Following the pre-reading sequence 471, the controller may perform a second read operation. The second read may be performed after a delay following the programming operation 474 in order to allow the threshold voltage distribution time to drift and stabilize after programming and prior to the second read. The second read operation may include applying a voltage across the memory cell while monitoring for snap back events. For example, the second read operation may be performed in order to determine whether the memory cell is now programmed in the first data state or the second data state following the pre-reading sequence 470. For example, the memory cell may be read utilizing a voltage at a typical Vdm level selected to be between and/or otherwise able to be utilized to distinguish between the predetermined threshold voltage distribution corresponding to the Vt of the first data state (e.g., set state) for the memory cell and the predetermined threshold voltage distribution corresponding to the Vt of the second data state (e.g., reset state) for the memory cell. As such, reading the memory cell utilizing this Vdm will allow for the confirmation of the data state of the memory cell following the pre-reading sequence 471.

For example, if a snap back event is detected when the Vdm voltage is applied, this may indicate that the memory cell is programmed to a first data state having a threshold voltage distribution below the applied voltage. Alternatively, when the Vdm voltage is applied and no snap back event is detected, this may indicate that the memory cell is programmed to a second data state having a threshold voltage distribution above the applied voltage. For example, detecting a snap back event may indicate that the memory cell is in the set state when the Vdm voltage is applied. Conversely, not detecting a snap back event may indicate that the memory cell is in the reset state when the Vdm voltage is applied.

As described above, the determination of whether to leave the memory cell in the state that it was programmed to during the pre-read operation 472 or to program it to a different state is based on whether a snap back event was detected when the voltage that is at the center of the predetermined threshold voltage distribution corresponding to the data state to which the memory cell is known to be programmed. As described above, it is random whether or a snap back event will occur upon application of the voltage that is at the center of the predetermined threshold voltage distribution corresponding to the data state to which the memory cell is known to be programmed. As such, a result of the second read operation confirming whether the memory cell was left in the state it was programmed to during the pre-read operation 472 or changed will also be a random output. Therefore, a result of the second read operation may correspond to a random data value (e.g., set, reset, 0, 1, low resistance, high resistance, etc.) associated with the detected state of the memory cell upon the second read operation. The random data value may be output and/or utilized in a manner similar to that described in FIG. 4A.

FIG. 4C is a graph illustrating examples of a pre-reading sequence 473 of a memory cell associated with generating a random data value consistent with a number of examples of the present disclosure. For example, FIG. 4C illustrates an example of a prereading sequence 473 of a memory cell such as a 3D XPoint™ memory cell and/or an SSM cell. FIG. 4C illustrates an example of a pre-reading sequence 473 of a memory cell initially programmed to a reset or high Vt state.

The pre-reading sequence 473 graph illustrates increasing time on the horizontal axis and increasing voltage on the vertical axis. The pre-reading sequence 473 may correspond to a set of operations to generate a random data value. In some examples, the set of operations may be performed and/or be caused to be performed by a memory controller such as memory controller 140 depicted in FIG. 1. In some examples, the pre-reading sequence 473 may be executed or caused to be executed by a controller in response to a request for a random data value from a host, such as host 126 depicted in FIG. 1.

The pre-reading sequence 473 may differ from a normal or traditional programming sequence. Normal or typical programming sequences may involve performing a pre-read of a memory cell by utilizing a Vdm between the threshold voltage distributions of possible states stored in the memory cell to determine, based on detecting a snap event, whether the memory cell is programed to a first state or a second state corresponding to storing a first data value or a second data value. Then, the normal or typical programming sequence may involve programming the memory cell to, for example, the reset state by applying a programming pulse at a voltage at an appropriate level and/or polarity to program the memory cell to the reset state.

The pre-reading sequence 473 may include a pre-read operation 472. The pre-reading operation 472 may correspond to the application of a first voltage value across a memory cell. The memory cell may be programmed to a known data state (e.g., set, reset, 0, 1, high resistance, low resistance, etc.). This may mean that the memory cell has previously been read as storing a known data state during a previous read. It may also mean that the memory cell has been pre-programmed to a known state with a write pulse. For example, the memory cell subjected to the pre-reading sequence 470 may include a memory cell in 3D XPoint™ memory and/or an SSM device pre-programmed to a state such as a reset state. In some examples, the reset state may be a higher Vt state that the set state. In some examples, the reset state may have an opposite polarity of the set state.

Upon programming a memory cell to a particular state, the corresponding threshold voltage may be somewhat unstable for a period of time following programming. As such, examples contemplated herein may include making time allotments for the threshold voltage of a memory cell to drift for a pre-defined period of time after programming in order to allow the threshold voltage distribution time to drift and stabilize. For example, pre-programming a memory cell to a known state may include stabilizing a threshold voltage of the memory cell pre-programmed to the particular state by pre-drifting the memory cell following pre-programming the memory cell to the particular state and prior to performing the pre-read operation 472 described below.

The memory cell may have a threshold voltage distribution corresponding to each state. That is, the Vt of the reset data state in a memory cell storing a reset data state may bounce or fluctuate within a first range of voltage values. The first range of voltage values may have a normal distribution corresponding to the threshold voltage distribution for the reset state in the memory cell. As mentioned, in some examples, the threshold voltage distribution for the reset state may have a negative polarity and/or a polarity opposite to that of the threshold voltage distribution of the set state. In some examples, the threshold voltage distribution for the reset state may be associated with higher voltage than the threshold voltage distribution of the set state. Further, the Vt of the set data state in a memory cell storing a set data state may bounce or fluctuate within a second range of voltage values. The second range of voltage values may have a normal distribution corresponding to the threshold voltage distribution for the set state in the memory cell. Again, the threshold voltage distributions for each data state for the memory cell may be pre-determined prior to the pre-reading sequence 473.

The pre-read operation 472 may be performed at a reset read voltage. The reset read voltage may be selected as a read voltage that is within a predetermined threshold voltage distribution corresponding to the reset state when the memory cell is programmed to the reset data state. For example, the first pre-read operation 472 may be performed at a reset read voltage that is within a predetermined threshold voltage distribution corresponding to the reset data state of a memory cell in 3D XPoint™ memory and/or an SSM.

The pre-read operation 472 may be performed by applying, across the memory cell, a reset read voltage corresponding to the center of the predetermined reset threshold voltage distribution to which the memory cell is programmed and monitoring whether a snap back event is detected in response.

For example, where the memory cell is known to be programmed to a reset state, the pre-read operation 472 may include applying a voltage having a value corresponding to a center and/or midpoint of the predetermined threshold voltage distribution for the reset data state in the memory cell storing the reset data state. In an example, a memory cell may be programmed to a reset state. A threshold voltage distribution for that particular memory cell storing that particular reset state may be predetermined. The pre-read operation 472 may involve applying a voltage from the center or midpoint of the threshold voltage distribution for that particular memory cell storing that particular reset state.

That is, in contrast to a normal or traditional read operation of a memory cell that utilizes a Vdm between the threshold voltage distributions of possible states stored in the memory cell, examples consistent with the present disclosure involve a pre-read operation 472 which performs a pre-read utilizing a voltage selected to be at the center of a distribution of pre-characterized Vt fluctuations for a data state that the memory cell is pre-determined to be storing.

As described above, applying a voltage selected to be at the center of a distribution of pre-characterized Vt fluctuations for a data state that the memory cell is pre-determined to be storing may have the effect of randomly triggering a snap back event. That is, since the actual Vt of a memory cell storing a particular state is naturally fluctuating within a pre-characterized distribution, applying a voltage that is at the center of that distribution may have the effect of triggering a snap back event fifty percent of the time and may not trigger a snap back event fifty percent of the time. Whether the actual Vt at, above, or below a voltage that is at the center of that distribution when it is applied is a random occurrence.

As such, application of the voltage that is at the center of that distribution that the memory cell is known to be programmed to is capable of producing a truly random outcome to the pre-read operation 472. Unlike utilizing the Vdm between the threshold voltage distributions of possible states stored in the memory cell, applying the voltage that is at the center of that distribution that the memory cell is known to be programmed to will not provide information sufficient to distinguish the data state or data value stored by the memory cell with any certainty. Instead, applying the voltage that is at the center of the distribution of the know data state or data value stored in the memory cell with produce a random outcome that corresponds to the actual Vt at the time of the pre-read operation 472 being at or below the applied voltage (e.g., evidenced by the detection of a snap back event) or being above the applied voltage (e.g., evidenced by no detection of a snap back event).

While the pre-reading sequence may optionally include the programming operation similar to those described with respect to FIGS. 4A-4B, the pre-reading sequence 473 is illustrated without such a programming operation. For example, it may be appreciated that a programming operation of an appropriate voltage level and/or polarity may be applied to the memory cell in order to refresh the reset state and/or to change the programmed data state of the memory cell to the set state. However, in some examples, the snapback event itself may place the memory cell in a data state other than the data state it was storing during the pre-read operation 472. For example, the programming operation may be skipped since a snap back event caused by the pre-read operation 472 to the memory cell, initially programmed to a reset data state, at a voltage corresponding to the center of the distribution of the reset data state may actually be programmed to the set data state by the snap back event. That is, the snap back event may cause the physical/electrical properties of the memory cell to be altered in such a way that the data state of the memory cell no longer corresponds to the reset state, but now corresponds to the set state. However, in any case including those where the snap back event reprogrammed the cell, the programming operation may be performed in order to optimize the programming to the new data state and/or reinforce electrical uniformity among the memory cells with respect to the Vt distributions of their new data state.

A controller, such as the controller 140 illustrated in FIG. 1, may be configured to determine whether or not to perform the programming operation. For example, the controller may be configured to determine whether to leave the memory cell programmed to a reset data state corresponding to a reset data value or to apply a programming signal to the memory cell configured to program and/or refresh the programming of the memory cell into the set data state corresponding to a set data value based on whether a snap back event was detected in the pre-read operation 472.

For example, a memory cell may be programmed to a reset state. In the pre-read operation 472, a voltage may be applied across the memory cell. The voltage may be a voltage at a center or midpoint of a predetermined voltage threshold distribution for the Vt of the reset state for the memory cell. The application of the voltage at this level may produce snap back events in a random distribution based on whether the actual Vt of the reset state for the memory cell has bounced at, above, or below the applied voltage during the pre-read operation 472. For example, if a snap back event is detected the controller may be configured to perform the programming operation by causing a write pulse to be applied to the memory cell to write the memory cell from a reset state to a set state. Alternatively, and as illustrated in FIG. 4C, the cells that experienced the snap back may not be subjected to the programming operation as the snap back event itself may have been sufficient to reprogram the memory cell from the reset state to the set state. If a snap back event is not detected, then the controller may be configured to forgo the programming operation and leave the memory cell in the reset state Following the pre-reading sequence 473, the controller may perform a second read operation. The second read may be performed after a delay in order to allow the threshold voltage distribution time to drift and stabilize after programming and prior to the second read. The second read operation may include applying a voltage across the memory cell while monitoring for snap back events. For example, the second read operation may be performed in order to determine whether the memory cell is now programmed in the reset data state or the set data state following the pre-reading sequence 473. For example, the memory cell may be read utilizing a voltage at a typical Vdm level selected to be between the predetermined threshold voltage distribution corresponding to the Vt of the reset data state for the memory cell and the predetermined threshold voltage distribution corresponding to the Vt of the reset data state for the memory cell. As such, reading the memory cell utilizing this Vdm will allow for the confirmation of the data state of the memory cell following the pre-reading sequence 473.

For example, if a snap back event is detected when the Vdm voltage is applied, this may indicate that the memory cell is programmed to a set data state. Alternatively, when the Vdm voltage is applied and no snap back event is detected, this may indicate that the memory cell is programmed to a reset data state. For example, detecting a snap back event may indicate that the memory cell is in the set state when the Vdm voltage is applied. Conversely, not detecting a snap back event may indicate that the memory cell is in the reset state when the Vdm voltage is applied.

As described above, it is random whether or a snap back event will occur upon application of the voltage that is at the center of the predetermined threshold voltage distribution corresponding to the data state to which the memory cell is known to be programmed. As such, a result of the second read operation confirming whether the memory cell was left in the state it was programmed to during the pre-read operation 472 or changed will also be a random output. Therefore, a result of the second read operation may correspond to a random data value (e.g., set, reset, 0, 1, low resistance, high resistance, etc.) associated with the detected state of the memory cell upon the second read operation. The random data value may be output and/or utilized in a manner similar to that described in FIG. 4A.

Figure 5:
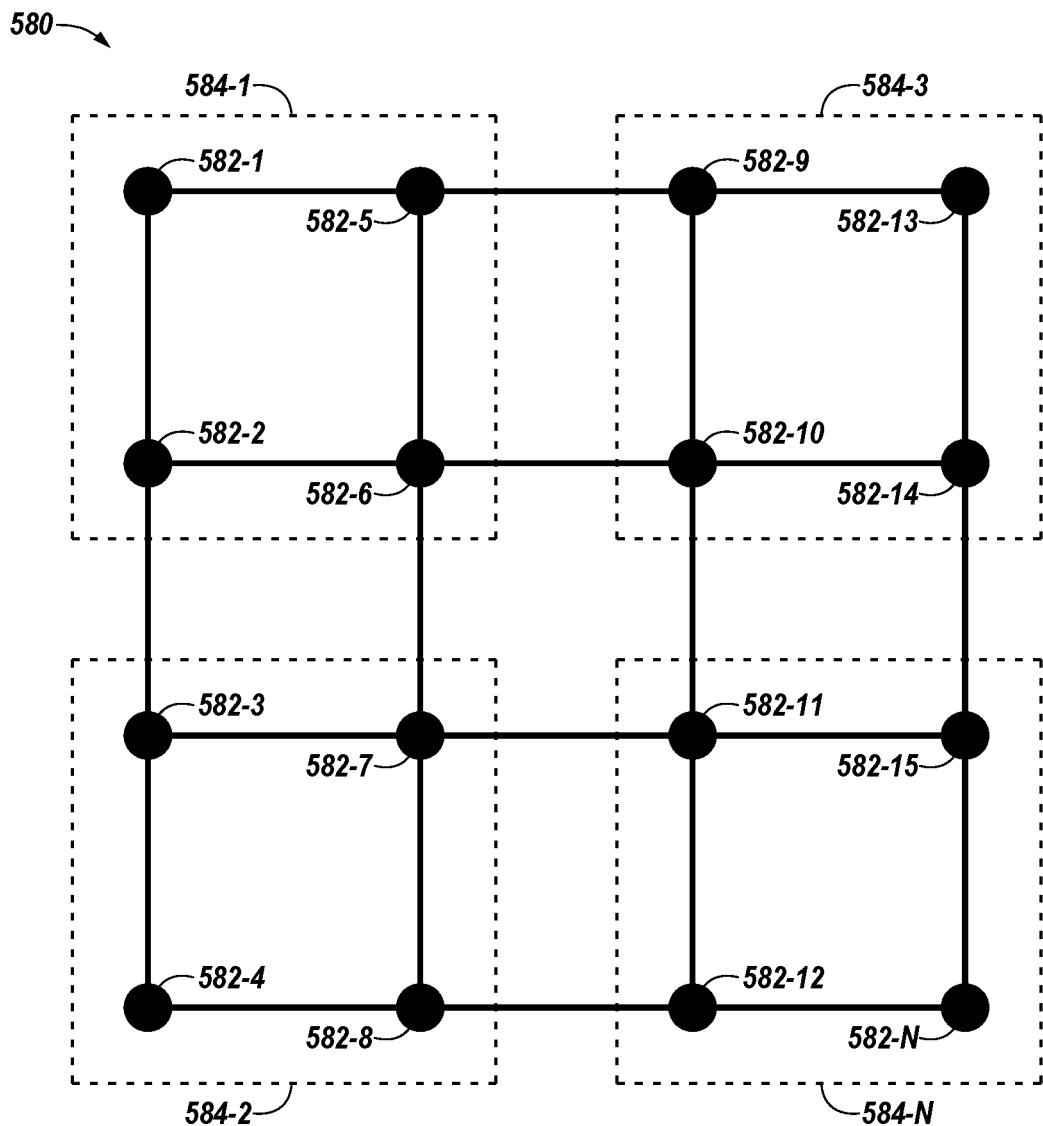
FIG. 5 is an illustration of an example of a memory array associated with generating a random data value consistent with a number of examples of the present disclosure.

FIG. 5 is an illustration of an example of a portion of a memory array 580 associated with generating a random data value consistent with a number of examples of the present disclosure. The described components, configurations, and/or operation of the memory elements described with respect to FIG. 5 may include and/or be interchanged with the described components, configurations, and/or operations in relation to any other of the FIGS. 1-4 and 6.

The memory array 580 may include a plurality of interconnected memory cells 582-1 . . . 582-N. The memory cells 582-1 . . . 582-N may be logically and or physically organized into groups to generate random data values in a manner consistent with a number of examples of the present disclosure. For example, the memory cells 582-1 . . . 582-N may be grouped together into physical and/or logical groups 584-1, 584-2, 584-3, and 584-N.

Each group 584-1, 584-2, 584-3, and 584-N may include a plurality of the memory cells 582-1 . . . 582-N of the array. For example, a first group 584-1 may include memory cells 582-1, 582-2, 582-5, and 582-6. The second group 584-2 may include memory cells 582-3, 582-4, 582-7, and 582-8. The third group 584-3 may include memory cells 582-9, 582-10, 582-13, and 582-14. The fourth group 584-N may include memory cells 582-11, 582-12, 582-15, and 582-N.

The groups 584-1 . . . 584-N may be operated as separate random data value generating components (e.g., regions) and/or as separate components of a single random data value generating component.

Memory cells 582-1 . . . 582-N may be organized into groups based on their respective predetermined threshold voltage distributions. For example, a controller, such as controller 140 in FIG. 1, may be configured to group memory cells into groups 584-1, 584-2, 584-3, and 584-N based on similarities between their respective predetermined threshold voltage distributions. For example, it may be determined that memory cells 582-1, 582-2, 582-5, and 582-6 have highly similar (e.g., within a threshold amount) and/or identical predetermined threshold voltage distributions corresponding to their data states. Therefore, memory cells 582-1, 582-2, 582-5, and 582-6 may be grouped into a same group (e.g., first group 584-1).

It may be determined that memory cells 582-3, 582-4, 582-7, and 582-8 have highly similar (e.g., within a threshold amount) and/or identical predetermined threshold voltage distributions corresponding to their data states. These cells may have sufficiently different (e.g., outside of the threshold amount) predetermined threshold voltage distributions corresponding to their data states from those memory cells in the first group 584-1. As such, memory cells 582-3, 582-4, 582-7, and 582-8 may be grouped into a same group (e.g., second group 584-2).

It may be determined that memory cells 582-9, 582-10, 582-13, and 582-14 have highly similar (e.g., within a threshold amount) and/or identical predetermined threshold voltage distributions corresponding to their data states. These cells may have sufficiently different (e.g., outside of the threshold amount) predetermined threshold voltage distributions corresponding to their data states from those memory cells in the first group 584-1 and the second group 584-2. As such, memory cells 582-9, 582-10, 582-13, and 582-14 may be grouped into a same group (e.g., third group 584-3).

It may be determined that memory cells 582-11, 582-12, 582-15, and 582-N have highly similar (e.g., within a threshold amount) and/or identical predetermined threshold voltage distributions corresponding to their data states. These cells may have sufficiently different (e.g., outside of the threshold amount) predetermined threshold voltage distributions corresponding to their data states from those memory cells in the first group 584-1, the second group 584-2, and/or the third group 584-3. As such, memory cells 582-11, 582-12, 582-15, and 582-N may be grouped into a same group (e.g., fourth group 584-N).

As such, the constituent memory cells 582-1 . . . 582-N of each group 584-1 . . . 584-N may share common threshold voltage distributions corresponding to their data states. As such, all the memory cells within a particular group may be utilized to simultaneously generate a plurality of random data values. Specifically, all of the plurality of memory cells within a particular group may be programmed to a particular state which is known prior to the pre-reading sequence. Then, a same voltage corresponding to a center or midpoint of the shared threshold voltage distribution for the state to which the cells are programmed may be applied to all of the plurality of memory cells within the particular group as part of a pre-read operation. Those cells in the group that demonstrate a snap back event during the pre-read operation may be programmed to a different state, while those that do not demonstrate a snap back event during the pre-read operation may be left in their same state. A Vdm between the threshold voltage distributions of the first and second state of the memory cells may be applied, and the resulting output may serve as a plurality of simultaneously generated random data values.

Each of the groups of memory cells 584-1 . . . 584-N may utilize different threshold voltage distributions corresponding to the data states of their respective constituent memory cells. That is, while the memory cells within a particular group may have common predetermined threshold voltage distributions corresponding to their data states, the memory cells in another of the groups may have different common predetermined threshold voltage distributions corresponding to their data states. As such, different applied voltages may be utilized for each one of the groups of memory cells 584-1 . . . 584-N. As described above, the output from operating on these various groups according to the examples consistent with the present disclosure may be combined and output as random data values.

Figure 6:
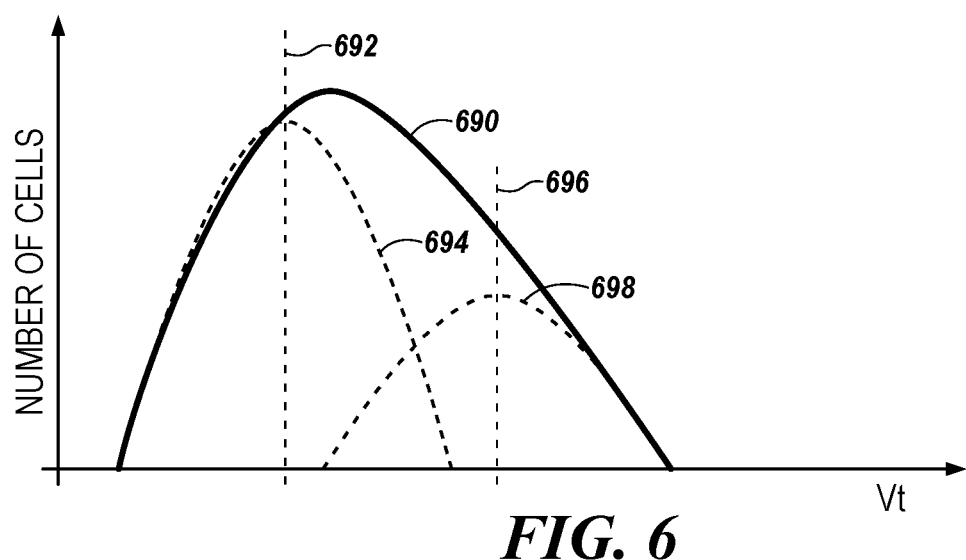
FIG. 6 is a diagram illustrating a threshold voltage distribution associated with generating a random data value consistent with a number of examples of the present disclosure.

FIG. 6 is a diagram illustrating a threshold voltage distribution 690 for a data state for a group of memory cells that do not share common predetermined threshold voltage distributions corresponding to their data states consistent a number of examples of the present disclosure. The described components, configurations, and/or operation of the memory elements described with respect to FIG. 6 may include and/or be interchanged with the described components, configurations, and/or operations in relation to any other of the FIGS. 1-5.

As described above, memory cells in an array may be grouped on the basis of having highly similar and/or identical predetermined threshold voltage distributions corresponding to their data states for the purposes of generating random data values consistent a number of examples of the present disclosure. However, in some examples, memory cells that do not share common predetermined threshold voltage distributions corresponding to their data states may be grouped together.

When the memory cells with non-identical center of threshold voltage distribution values are grouped together, the resulting threshold voltage distribution for the group 690 may have a non-normal (non-Gaussian) distribution. For example, a group may include two (or more) different memory cells. Each of the memory cells may have a corresponding threshold voltage distribution for a particular state.

For example, the first memory cell may have a first threshold voltage distribution 694 for a particular state. The first memory cell may have a first center or midpoint voltage amount 692 for the first threshold voltage distribution 694. That is, consistent with the above-described examples of the present disclosure, the midpoint voltage amount 692 may correspond to the demarcation or read voltage which, when applied to the first memory cell programmed to the particular state and having the first threshold voltage distribution 694, would generate a snap back event or not generate a snap back event approximately randomly.

The second memory cell may have a second threshold voltage distribution 698 for the particular state. The second memory cell may have a second center or midpoint voltage amount 696 for the second threshold voltage distribution 698. That is, consistent with the above-described examples of the present disclosure, the midpoint voltage amount 696 may correspond to the demarcation or read voltage which, when applied to the second memory cell programmed to the particular state and having the second threshold voltage distribution 698, would generate a snap back event or not generate a snap back event approximately randomly.

When grouped together, the resulting threshold voltage distribution for the group 690 may have a non-normal (non-Gaussian) distribution. Further, utilizing one of the center or midpoint voltage amount (e.g., the first center or midpoint voltage amount 692, the second center or midpoint voltage amount 696, etc.) with the resulting threshold voltage distribution for the group 690 may generate snap back events in a non-random matter. For example, if the first center or midpoint voltage amount 692 was used in the pre-read operation of the memory cells in the first group, a skew in the amount of snap back events detected may emerge. For example, the pre-read operation may produce a snap back event thirty percent of the time and may not produce a snap back event seventy percent of the time.

In order to address this skew, a bias may be applied to the group. For example, the voltage at which the pre-reading operation of the group will be performed may be biased (e.g., higher, lower, etc.) to achieve a voltage closer to a center or midpoint of the threshold voltage distribution for the group 690. That is, a new voltage at which the pre-reading operation of the group will be performed may be selected which produced a relatively most random outcome from the pre-read operation. In the example given above, the voltage applied during the pre-read operation may be moved up from the first center or midpoint voltage amount 692 for the first threshold voltage distribution 694 to a new voltage amount between the first center or midpoint voltage amount 692 for the first threshold voltage distribution 694 and the second center or midpoint voltage amount 696 for the second threshold voltage distribution 698.

Alternatively and/or additionally, a bias may be applied on the back end to adjust for the non-random skew induced by non-identical center of threshold voltage distribution values among the group. For example, a data value output from the second read of the memory cell following the pre-reading sequence may be altered to bias the outputs back to random. In the example given above, twenty percent of the outputs resulting from not detecting a snap back event and leaving the memory cell in its pre-read data state may be changed to another data state value to restore a fifty percent to fifty percent distribution among the outputs.

The above-described biasing mechanism and others are equally applicable when attempting to blend different groups of memory cells and/or their outputs together.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for generating a random data value, comprising:
    performing a first read operation on a plurality of memory cells programmed to a first state corresponding to a first data value, wherein the first read operation is performed using a first read voltage that is within a predetermined threshold voltage distribution corresponding to the first state; and
    performing a second read operation to determine whether each of the plurality of memory cells is in the first state or a second state, corresponding to a second data value, using a second read voltage that is between the predetermined threshold voltage distribution corresponding to the first state and a second threshold voltage distribution corresponding to the second state,
    wherein a result of the second read operation corresponds to a random data value based on the threshold voltage of each of the plurality of memory cells during the first read operation.

2. The method of claim 1, wherein the method further comprises:
    applying a programming signal to a first portion of the plurality of memory cells based on whether the first read operation resulted in a snapback event at the portion of the plurality of memory cells, wherein the programming signal is configured to place each of the first portion of the plurality of memory cell in the second state.

3. The method of claim 2, wherein the method further comprises, subsequent to performing the second read operation:
    programming the plurality of memory cells to the first state;
    performing a third read operation on the plurality of memory cells using the read voltage that is within the predetermined threshold voltage distribution corresponding to the first state;
    applying a subsequent programming signal to a second portion of the plurality of memory cells responsive to the third read operation on the memory cell resulting in a snapback event, wherein the subsequent programming signal is configured to place each of the second portion of the plurality of memory cells in the second state corresponding to the second data value; and
    performing a fourth read operation to determine whether each of the plurality of memory cell is in the first state or the second state using the second read voltage.

4. The method of claim 2, wherein the method further comprises:
    refraining from applying the programming signal to the memory cell responsive to the first read operation not resulting in a snapback event.

5. The method of claim 1, wherein the method further comprises:
    determining the predetermined threshold voltage distribution corresponding to the first state based on a plurality of programming and read operations.

6. The method of claim 1, wherein the method further comprises:
    selecting a voltage at a center of the predetermined threshold voltage distribution corresponding to the first state to be the first read voltage; and
    stabilizing a threshold voltage of each of the plurality of memory cells programmed to the first state by pre-drifting the plurality of memory cells following pre-programming the plurality of memory cells to the first state and prior to performing the first read operation.

7. An apparatus, comprising:
    an array of memory cells each programmable to a first state corresponding to a first data value and a second state corresponding to a second data value; and
    a controller coupled to the array and configured to generate a random one of the first data value and the second data value, the controller configured to:
        apply a first read voltage to a memory cell programmed to the first state, wherein the memory cell programmed to first state has a predetermined threshold voltage distribution associated therewith, and wherein the first read voltage has a value selected to be within the predetermined threshold voltage distribution;
        apply a programming signal to the memory cell responsive to the applied first read voltage resulting in a snapback event, wherein the programming signal is configured to place the memory cell in a second state corresponding to a second data value; and
        apply a second read voltage to the memory cell to determine whether the memory cell is in the first state or the second state, wherein the second read voltage is not within the predetermined threshold voltage distribution associated with the first state;
    wherein the generated random one of the first data value and the second data value is based on the threshold voltage of the memory cell upon application of the first read voltage to the memory cell.

8. The apparatus of claim 7, wherein the value of the first read voltage is selected to be at a center of the predetermined threshold voltage distribution of the first state.

9. The apparatus of claim 8, wherein a detection of the snapback event responsive to the applied first read voltage serves as an indication of whether a threshold voltage of the memory cell programmed to the first state is above or below the value of the first read voltage.

10. The apparatus of claim 8, wherein the center of the predetermined threshold voltage distribution of the first state is a center of the threshold voltage distribution of the first state as biased to account for variation in threshold voltage distributions across a portion of the plurality of cells of the array of memory cells.

11. The apparatus of claim 7, wherein the memory cell is a resistance variable memory cell.

12. That apparatus of claim 7, wherein the memory cell comprises a chalcogenide material serving as a storage element of the memory cell.

13. The apparatus of claim 7, wherein the first state is a set state and the second state is a reset state.

14. The apparatus of claim 7, wherein the controller is further configured to provide the generated random one of the first data value and the second data value to a host.

15. The apparatus of claim 7, wherein the controller is further configured to generate the random one of the first data value and the second data value responsive to a request from a host.

16. A system comprising:
an array of memory cells each programmable to a first state corresponding to a first data value and a second state corresponding to a second data value; and
a controller coupled to the array and configured to generate a random one of the first data value and the second data value, the controller configured to:
apply a first read voltage to a memory cell programmed to the first state, wherein the memory cell programmed to first state has a predetermined threshold voltage distribution associated therewith, and wherein the first read voltage has a value selected to be at a center of the predetermined threshold voltage distribution;
determine, based on whether a snapback event indicative of a value of a threshold voltage of the memory cell relative to the first read voltage is detected responsive to the application of the first read voltage, whether to leave the memory cell programmed to the first state or to apply a programming signal to the memory cell configured to place the memory cell in a second state corresponding to a second data value; and
apply a second read voltage to the memory cell to determine whether the memory cell is in the first state or the second state, wherein the second read voltage is not within the predetermined threshold voltage distribution associated with the first state,
wherein the generated random one of the first data value and the second data value is determined based on the threshold voltage of the memory cell relative to the first read voltage as confirmed by applying the second read voltage.

17. The system of claim 16, wherein the controller is configured to:
group the memory cell with other memory cells of the array of memory cells having an identical value at a respective center of their corresponding predetermined threshold voltage distributions to a value of the center of the predetermined threshold voltage distribution for the memory cell programmed to first state;
generate a random one of the first data value and the second data value from each of the other memory cells of the array based on whether the application of the first read voltage to each of the other memory cells results in a respective snapback event.

18. The system of claim 16, wherein the controller is configured to:
group the memory cell and other memory cells of the array programmed to the first state;
generate a random one of the first data value and the second data value from each of the other memory cells of the array based on:
whether the application of the first read voltage to each of the other memory cells results in a respective snapback event; and
a bias applied to adjust for a non-random skew induced by non-identical center of threshold voltage distribution values among the memory cell and the other memory cells.

19. The system of claim 16, wherein the controller is configured to:
group a first portion of an array of memory cells, the first portion including the memory cell and a first plurality of other memory cells programmed to the first state, into a first group based on the memory cell and the first plurality of other memory cells having a first identical center of threshold voltage distribution value to one another;
group a second portion of an array of memory cells, the second portion including a second plurality of other memory cells programmed to the first state, into a second group based on the second plurality of other memory cells having, a second identical center of threshold voltage distribution value to one another;
utilize the first read voltage to generate a random one of the first data value and the second data value from each of the first plurality of other memory cells of the array based on whether the application of the first read voltage to each of the first plurality of other memory cells results in a respective snapback event; and
utilize a third read voltage, having a value selected to be at the second identical center of threshold voltage distribution value among the second plurality of other memory cells, to generate a random one of the first data value and the second data value from each of the second plurality of other memory cells of the array based on whether an application of the third read voltage to each of the second plurality of other memory cells results in a respective snapback event.

20. The system of claim 16, wherein the controller is configured to incorporate the generated random one of the first data value and the second data value into a cryptographic function.

* * * * *